US 6,885,445 B2

(12) United States Patent
Bennett et al.

(10) Patent No.: US 6,885,445 B2
(45) Date of Patent: Apr. 26, 2005

(54) ELECTRON MICROSCOPE AND SPECTROSCOPY SYSTEM

(75) Inventors: Robert Bennett, Gloucestershire (GB); Andrew Mark Woolfrey, Gloucestershire (GB); John Charles Clifford Day, Bristol (GB); Angus Bewick, Bristol (GB)

(73) Assignee: Renishaw PLC, Gloucestershire (GB)

( * ) Notice: Subject to any disclaimer, the term of this patent is extended or adjusted under 35 U.S.C. 154(b) by 267 days.

(21) Appl. No.: 10/211,558

(22) Filed: Aug. 5, 2002

(65) Prior Publication Data

US 2003/0053048 A1 Mar. 20, 2003

Related U.S. Application Data

(63) Continuation-in-part of application No. 09/446,693, filed as application No. PCT/GB99/01395 on May 5, 1999.

(30) Foreign Application Priority Data

May 9, 1998 (GB) ............................................. 9809834
May 9, 1998 (GB) ............................................. 9809835
Aug. 3, 2001 (GB) ............................................. 0118981

(51) Int. Cl.[7] ............................... G01J 3/44; G01J 3/28; H01J 37/30
(52) U.S. Cl. ...................... 356/301; 356/326; 250/311
(58) Field of Search .............................. 356/301, 326, 356/323, 328, 331–334; 250/396 R–400, 305–311

(56) References Cited

U.S. PATENT DOCUMENTS 5,194,912 A * 3/1993 Batchelder et al. ......... 356/301
5,661,557 A    8/1997 Da Silva et al.
5,689,333 A * 11/1997 Batchelder et al. ......... 356/301
5,956,136 A    9/1999 Da Silva et al.
6,476,387 B1 * 11/2002 Nishimura et al. ......... 250/306

FOREIGN PATENT DOCUMENTS

| EP | 0 184 792 A1 | 6/1986 |
| EP | 0 543 578 A1 | 5/1993 |
| EP | 0 874 228 A1 | 12/1997 |
| FR | 78 23012 | 8/1978 |
| FR | 2 596 863 | 10/1987 |
| FR | 2 726 365 | 5/1996 |
| GB | 2 079 486 A | 1/1982 |
| WO | WO 95/20242 | 7/1995 |
| WO | WO 95/32408 | 11/1995 |
| WO | WO 98/15867 | 4/1998 |

OTHER PUBLICATIONS

"Raman/SEM Microscopy—Integrating Molecular Compositional Imaging and Ultramicroscopy"; Timothy M. Prusnick and Patrick J. Treado; Dept. of Chemistry; Univ. of PA.
Ichiro Ando, "A new cathodoluminescence detector for sem and its application to semiconductor material", Research Department, JEOL News, 12e, No. 2, 1974.
Oxford Instruments, "Cathodoluminescence system for high resolution imaging and spectroscopy", 1996.

* cited by examiner

*Primary Examiner*—Layla Lauchman
(74) *Attorney, Agent, or Firm*—Oliff & Berridge, PLC

(57) ABSTRACT

An electron microscope 10 is adapted to enable spectroscopic analysis of a sample 16. A parabolic mirror 18 has a central aperture 20 through which the electron beam can pass. The mirror 18 focuses laser illumination from a transverse optical path 24 onto the sample, and collects Raman and/or other scattered light, passing it back to an optical system 30. The mirror 18 is retractable (within the vacuum of the electron microscope) by a sliding arm assembly 22.

26 Claims, 13 Drawing Sheets

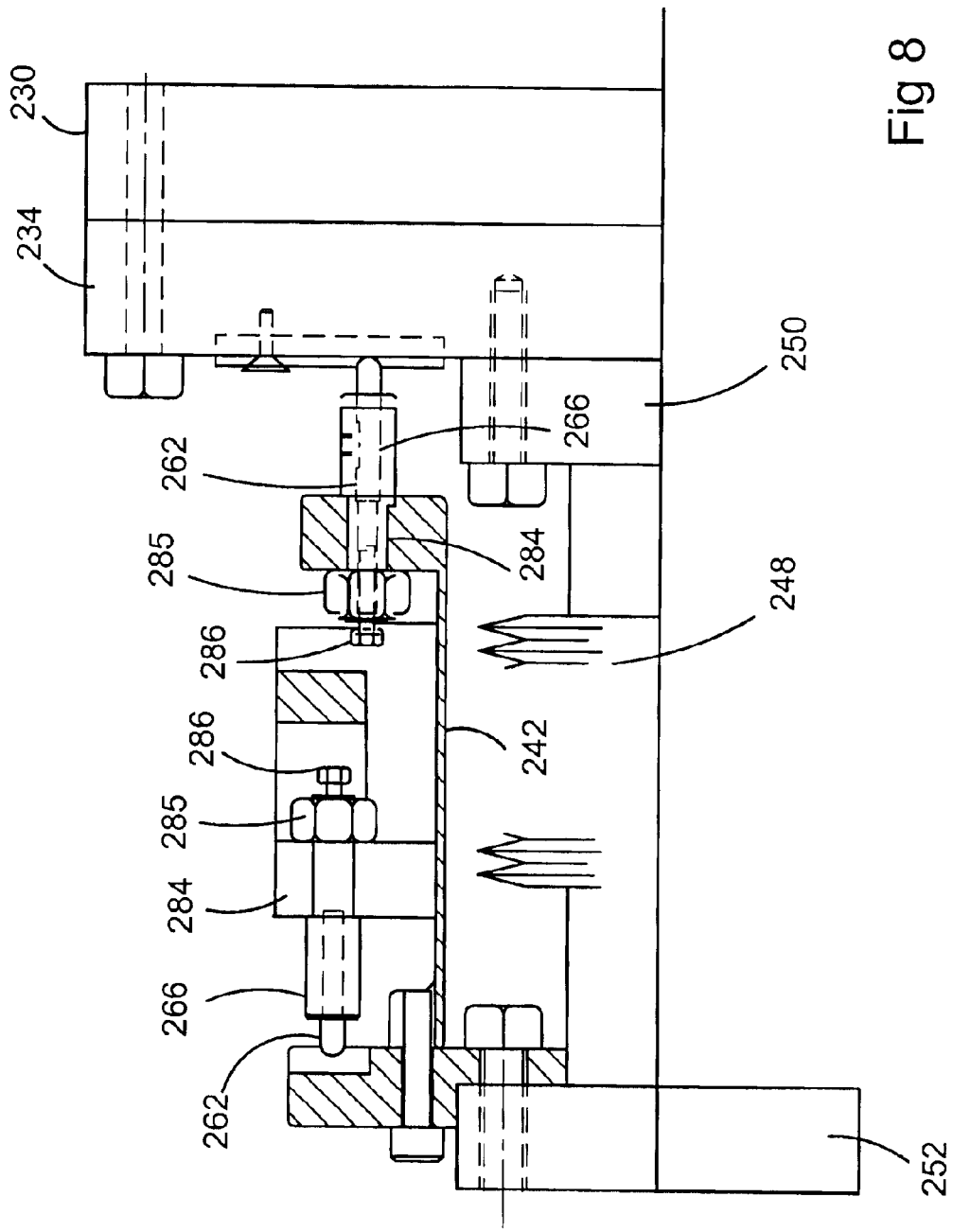

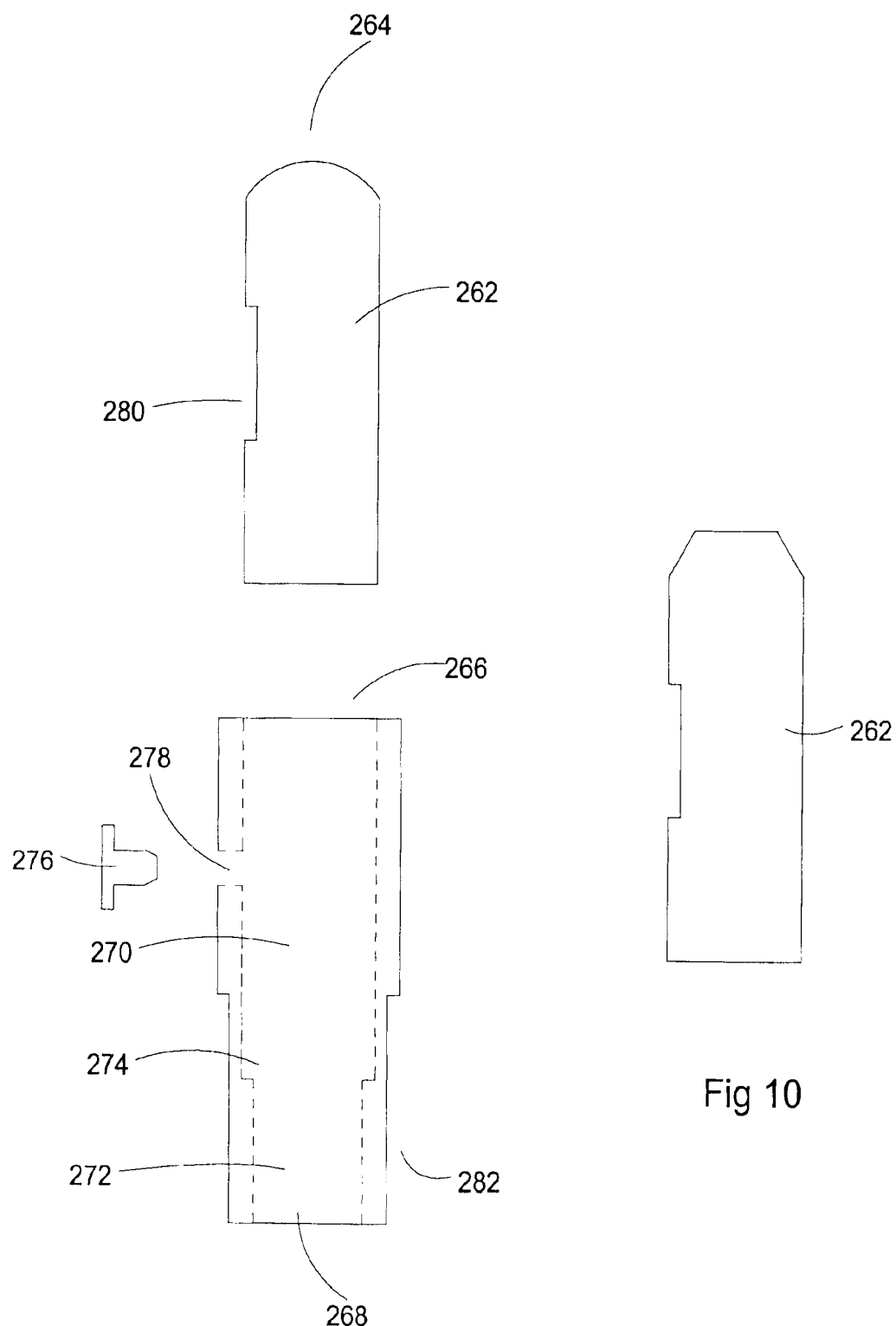

ELECTRON MICROSCOPE AND SPECTROSCOPY SYSTEM

CROSS-REFERENCE TO RELATED APPLICATIONS

This application is a continuation-in-part of U.S. patent application Ser. No. 09/446,693 filed Dec. 22, 1999, now abandoned which is the U.S. national stage of International Patent Application No. PCT/GB99/01395 filed May 5, 1999 and published under the number WO99/58939.

FIELD OF THE INVENTION

This invention relates to sample analysis systems. In a preferred embodiment, for example, an electron microscope is combined with a spectroscopy system, e.g. a Raman or photoluminescence or cathodoluminescence spectroscopy system.

BACKGROUND AND SUMMARY OF THE INVENTION

Such combined systems have previously been disclosed in French patent specification no: FR 2596893 and International patent specification no. WO 95/20242.

In FR 2596863, a plane mirror is placed it an electron microscope, at 45° to its axis. For Raman spectroscopy, an illuminating laser beam passes through a window in the electron microscope housing. The 45° mirror reflects the laser beam towards a sample, along the axis of the electron microscope. The beam is focussed to a spot on the sample by a Cassegrain objective. Raman scattered light is collected by the Cassegrain objective and reflected by the mirror through the window to a spectrometer. For electron microscopy, the electron beam irradiates the sample through central apertures in the 45° mirror and the Cassegrain objective. Simultaneous examination of the sample by both electron microscopy and Raman spectroscopy is therefore possible, and the Cassegrain objective has a wide collection angle for efficient collection of the very weak Raman scattered light. However, in practice it is difficult to mount both this objective and the 45° mirror in the restricted space available in the sample chamber of a commercial electron microscope. FR 2596863 therefore mounts them within the electron lens system.

WO 95/20242 points out various problems of that arrangement. It proposes to overcome these problems by mounting the sample on a displaceable mount. The optical system for the Raman spectroscopy is not co-axial with the electron microscope, and the sample is moved on its mount from one to the other. However, this makes simultaneous examination by the Raman and electron microscope systems impossible. It also requires the mount to be an expensive precision stage in order to move the sample precisely between the respective analysis points of the electron system and the optical system.

A book "Raman Microscopy: Developments and Applications", edited by George Turrell et al, Academic Press Limited, 1996, Chapter 5, pages 201–220, suggests on pages 215–216 that a parabolic mirror can be used in place of a Cassegrain objective and 45° plane mirror. This is mechanically simpler, and can be mounted within the sample chamber of the electron microscope. For Raman spectroscopy, laser light is injected transversely to the axis of the electron beam. The parabolic mirror reflects it through 90°, coaxial with the electron beam, and focuses it to a spot on the sample. The electron beam again passes through a central aperture in the parabolic mirror. The parabolic mirror collects Raman and other scattered light from its focal point, and passes it back along the transverse path out of the sample chamber of the electron microscope.

However, when such a mirror is not in use, it tends to hinder other analytical techniques, such as x-ray spectrometry of the x-rays produced by the electron bombardment of the sample. Furthermore, when the mirror is placed in the sample chamber it must be correctly aligned. Not only must the central aperture be aligned with the electron beam, but also the optical focus of the mirror must be relocated at the same point on the sample, relative to the electron beam.

It is desirable to have precise and repeatable positioning of the mirror with respect to both the analytical axis and an optical system positioned along the optical axis.

Furthermore, as an analysis system such as a scanning electron microscope may operate under ultra high vacuum it is preferable for adjustment of the mirror in both the operative and inoperative positions to be possible external to the vacuum.

One aspect of the present invention provides an adapter for performing an optical analysis (e.g. by spectroscopy) of a sample mounted in a sample chamber of another analytical apparatus (such as an electron microscope), said analytical apparatus having an analytical axis and projecting an analysis beam generally along said analytical axis towards a sample, the adapter comprising:

a mirror located so as to receive an input light beam (e.g. a laser beam) along an axis generally transverse to said analytical axis, said mirror directing said input light beam generally along the analytical axis towards the sample, and collecting the scattered light received from the sample and directing said scattered light generally along the transverse axis, wherein said mirror is movable between an operative position on said analytical axis and an inoperative position away from said analytical axis.

Preferably, an optical system is provided for processing the input light beam and the scattered light, said optical system being movable together with the mirror as the mirror moves between the operative and inoperative positions. Preferably the optical system includes one or more filters for rejecting light having the wavelength of the input light beam from said scattered light.

Preferably the mirror is concave, in order to focus the input laser beam onto the sample and collimate said scattered light.

Preferably the concave mirror is a paraboloid mirror, in order to focus a spot (which can be diffraction limited) onto the sample from a collimated input light beam, and in order to produce a collimated output light beam of said scattered light collected from said spot. The optical system may output the scattered light to a spectroscopy system, to analyse the spectrum of the scattered light collected from the spot.

A second aspect of the present invention relates to a light injection and rejection arrangement for a spectroscopy system.

A spectroscopy system is known from European Patent Application No. EP 543578, in which exciting laser light is injected into an optical path and directed towards a sample by a dichroic filter. The dichroic filter is preferably a holographic filter at a low angle of incidence, e.g. 10° to the optical path. Light which is epi-scattered from the sample returns back along the optical path to the dichroic filter. Desired inelastically scattered light (e.g. Raman) passes through the filter to a spectrometer system, while undesired elastically scattered (Rayleigh) light is rejected by the filter.

The filter in such an arrangement must be designed to reflect the wavelength of the laser used. This ensures that it can reflect the incoming laser light towards the sample, and can reject the elastically scattered light having the same wavelength as the laser.

It is often desirable to be able to change the laser, in order to use a different excitation wavelength.

With the arrangement of EP 543578, the means that the filter must also be changed to match the new wavelength. Unless special measures are provided for accurate positioning of the filters, this can entail an awkward and time-consuming job of realigning the system with the new filter.

In its second aspect, the present invention provides a light injection and rejection arrangement for a spectroscopy system, for use with at least two different monochromatic light inputs (such as lasers), comprising:

an optical path extending between a sample to be analysed and a spectroscopy system for performing such analysis, first and second inputs for receiving respective first and second excitation beams at respective first and second wavelengths, a first filter located in the optical path, at an angle such that it directs the first input beam towards the sample, and rejects elastically scattered light received from the sample while passing inelastically scattered light for analysis towards the spectroscopy system, a second filter located in the optical path, at an angle such that it directs the second input beam towards the sample, and rejects elastically scattered light received from the sample while passing inelastically scattered light for analysis towards the spectroscopy system, light being received from the second filter which has been rejected from the optical path by the second filter when the sample is excited at the first wavelength, said light therefore representing desired inelastically scattered light, and said rejected but desired inelastically scattered light either being recombined with other inelastically scattered light, or being detected separately.

A third aspect of the present invention provides an adapter for performing optical analysis of a sample mounted in a sample chamber of another analytical apparatus, said analytical apparatus having an analytical axis and projecting an analysis beam generally along said analytical axis towards a sample;

the adaptor comprising an optical element located so as to collect scattered or generated light received from the sample and directing said light generally along an optical axis at an angle to the analytical axis;

wherein said optical element is adjustable between an operative position on said analytical axis and an inoperative position away from said analytical axis;

characterised in that the operative position is defined by an adjustable mount which restrains movement of the optical element in six degrees of freedom.

Preferably the adjustable mount is kinematic.

Preferably there is reduced pressure inside the sample chamber, wherein said reduced pressure is used to bias the optical element towards the operative position.

Preferably the optical element also receives an input light beam along the optical axis, said optical element directing said input light beam towards the sample.

Preferably the optical element is a mirror. It may alternatively be a fibre optic light collection element.

Preferably the optical axis is generally transverse to the analytical axis.

The inoperative position may be defined by a second mount which constrains movement of the optical element in six degrees of freedom. This second mount may also be adjustable.

A fourth aspect of the present invention provides an adapter for performing optical analysis of a sample mounted in a sample chamber of another analytical apparatus, said analytical apparatus having an analytical axis and projecting an analysis beam generally along said analytical axis towards a sample;

the adapter comprising a first optical element having a first focal plane, the first optical element being located so as to collect scattered or generated light received from the sample and directing said light generally along an optical axis at an angle to the analytical axis;

wherein said optical element is adjustable between an operative position on said analytical axis and an inoperative position away from said analytical axis;

wherein a second optical element, having a second focal plane, is provided in a fixed relationship the first optical element to direct light directed along the optical axis by the first optical element towards an optical analyser;

characterised in that the first and second optical elements are arranged such that when the first optical element is in the operative position, their focal planes are parallel with the direction of movement of the first optical element;

such that there is at least part compensation for inaccuracies in the positioning of the first optical element in tis operative position.

Preferably a location mount is provided to define the position of the first optical element in its operative position; and wherein when the first optical element is in the operative position, the ratio of the focal length of the first optical element to the focal length of the second optical element is inverse to the ratio of the distance along the optical path between the focal point of the first optical element and the location mount to the distance along the optical path between the focal point of the second optical element and the location mount.

Preferably the focal lengths of the first and second optical elements are equal and wherein the distance along the optical path between the focal point of the first optical element and the location mount is equal to the distance along the optical path between the focal point of the second optical element and the location mount when the first optical element is in the operative position.

Preferably the first and second optical elements comprise parabolic mirrors.

A fifth aspect of the present invention provides an adapter for performing optical analysis of a sample mounted in a sample chamber of another analytical apparatus, said analytical apparatus projecting an analysis beam towards a sample;

the adapter comprising an optical element located so as to collect scattered or generated light received from the sample and directing said light generally along an optical axis and to the optical analysis means;

characterised in that the optical element is a parabolic mirror;

wherein at least one mirror is provided to align light reflected by the parabolic mirror with the optical, analysis means, the position of the at least one mirror being adjustable;

and wherein distortion at the optical analysis means is corrected using image, processing software.

Preferably a second parabolic mirror is located between said parabolic mirror and the optical analysis means, wherein the two parabolic mirrors are arranged in an aberration-cancelling orientation. A further two parabolic mirrors may be located between, said parabolic mirror and the optical analysis means, wherein the four parabolic mirrors are arranged in an aberration-cancelling orientation.

Reference should be made to U.S. Pat. No. 5,446,970 for a discussion of one meaning of the terms "kinematic", "kinematically" and like terms, as used in this specification. These terms encompass not only kinematic supports in which point contacts are provided between the respective pairs of elements on the carrying and receiving members, but also semi- or quasi-kinematic supports, in which there are small areas or lines of contact between the respective elements.

BRIEF DESCRIPTION OF THE DRAWINGS

Combined electron microscopy and spectroscopy systems which exemplify the invention will now be described, with reference to the accompanying drawings in which:

FIG. 8 shows an adjustable kinematic mount of the retraction mechanism;

FIG. 9 is an exploded diagram of part of an adjustable kinematic mount;

FIG. 10 is an alternative kinematic mount;

DESCRIPTION OF PREFERRED EMBODIMENTS

Figure 1:
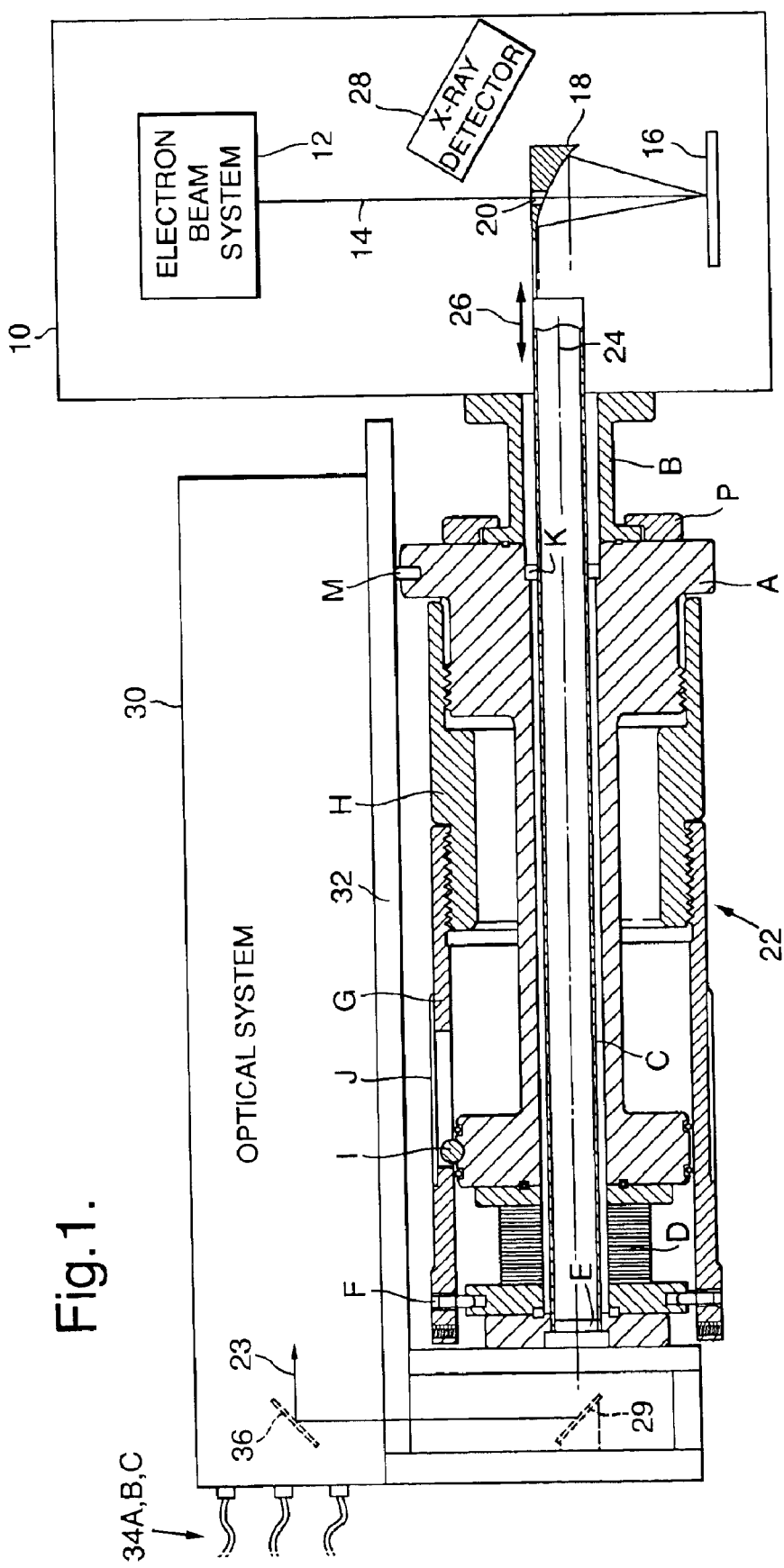
FIG. 1 is a schematic representation of the combined systems, an adapter between the systems being shown in cross-section.

FIG. 1 shows a scanning electron microscope (SEM) 10 with a conventional electron beam generation, focusing and scanning system 12. This projects a beam of electrons generally along an analytical axis 14 to a sample 16, in a well-known manner.

In place of a scanning electron microscope, the invention may also be used with other types of analytical system, including transmission electron microscopes, and also with apparatus such as ion beam bombardment systems.

A parabolic or other concave mirror 18 is mounted generally on the axis 14 above the sample 16, and has a central aperture 20 so that the electron beam may pass through. The parabolic mirror 18 is mounted on a mirror holder arm assembly 22, described below, having an optical axis 24 which is generally transverse to the analytical axis 14 of the SEM. The mirror holder 22 is able to retract the parabolic mirror 18 as shown by double-headed arrow 26, between an operative position (as shown) and an inoperative position (retracted away from the analytical axis 14). Thus, when in the inoperative position, the parabolic mirror 18 does not interfere with other equipment within the scanning electron microscope, such an x-ray detector 28 which can be used to detect x-rays generated by the bombardment of the sample 16 with the electron beam.

An optical system 30 is mounted on an optical bench 32, which is in turn mounted on the mirror holder arm assembly 22. As described in more detail below, the mirror holder 22 moves the optical system 30 together with the parabolic mirror 18, in order to maintain alignment between the two. The optical system 30 includes input and output optical fibre connections 34A,B,C. These receive an input from a laser, and take one or more outputs to an external spectrometer, such as a Renishaw Mk III Raman Spectrometer. Further details of the optical system 30 are described later.

The optical system directs the input laser beam via 45° mirrors 36,29 along the optical axis 24 of the mirror holder arm assembly 22 to the parabolic mirror 18, which focuses it to a (preferably diffraction-limited) spot on the sample 16. The parabolic mirror 18 also collects scattered light from this spot, collimates it and feeds it back in the return direction along the optical axis 24 to the optical system 30. For example, there may be inelastically scattered light such as Raman scattering, or fluorescence or photoluminescence. It will also include elastically scattered (Rayleigh) light at the laser wavelength. Alternatively, or additionally, the light collected from the sample 16 by the mirror 18 may be cathodoluminescence, generated by the action of the electron beam on the sample without the need for a laser input. It will be appreciated that the study of the inelastically scattered light may be performed simultaneously with the electron microscopy, or immediately before or after the electron microscopy, without the need to change the set up. It is therefore easy to correlate the results of the electron microscopy with the results of the spectroscopy.

The mirror holder must have the ability to move the parabolic mirror within the vacuum of the scanning microscope to a sensitivity of 0.1 mm. This tolerance is set by the requirement that the 1 mm aperture running vertically through the mirror is aligned on the axis of the electron optics with an unrestricted line of sight between the electron microscope objective and the sample positioned at the focal point of the parabola. Perpendicular to the axis 24 of the mirror holder arm the total movement of the parabola need only be a few millimeters, sufficient to compensate for manufacturing and assembly tolerances in the complete system. Along the axis of the arm the movement must be at least 50 mm so that the parabola may be retracted clear of the sample area of the microscope. This movement must be performed without affecting the vacuum of the SEM. In addition, this movement should not disturb the very critical optical alignment between the parabola and the laser source. The latter is the reason why the arm is mounted rigidly with respect to the optical base 32 which therefore must move with the arm as it is adjusted. We have found it difficult merely to rely on the fact that the laser beam it collimated between the optical system and the parabolic mirror; any minute misalignment between the axis of the beam and the axis of the parabola would mean that the focus must be readjusted after each retraction of the mirror.

Two methods can be used for creating a vacuum seal capable of linear movement. One is a sliding O-ring arrangement. However, we prefer a bellows arrangement. Bellows are a much more reliable form of seal and are suitable for much lower pressures, they also allow tilt and a slight lateral movement. O-ring seals are cheaper to make but do not allow any tilt and are prone to degradation with use. In the preferred embodiment it was decided to use edge welded bellows, rather than the cheaper hydroformed bellows, because this gives greater extension.

Various means of driving the extension are possible, including linear bearing tracks and screw drives, however the simplest and cheapest solution was deemed to be a simple screwed collar arrangement which imparts both rigidity and sensitivity with a minimum of weight and components.

As shown in FIG. 1, the arm assembly 22 consists of a main body piece A that is attached to the microscope via a transition piece B. The transition piece will be designed to suit whichever make or model of microscope is required and allows the body to become a standard item. The transition piece and body are joined by O-ring seals compressed at the body side by a separate split clamp P. This clamp allows the body to be rotated to provide rotational alignment.

The tubular optical arm C which supports the parabolic mirror 18 is attached to the body by the edge welded bellows D. An O-ring sealed optical flat E retained by a threaded ring provides the vacuum window for light extraction.

The junction of the bellows and vacuum arm is supported by two orthogonal sets of opposing threaded pins at F. Adjustment of these pine moves the end of the optical arm with respect to the microscope and consequently moves the parabola within the microscope. These pins are located in a cylinder G which is slidably mounted on the body A. The cylinder G is threaded with a left-hand thread at the opposite end. This cylinder is screwed onto the adjusting collar H that is in turn screwed via a right hand thread to the main body A. Rotating this adjusting collar causes the cylinder G to slide in or out from the body and so effects the translational motion of the parabola into the microscope.

When the adjusting collar is turned a torque will be applied to the bellows and optical arm. Although the bellows will prevent the arm from rotating it was felt prudent to incorporate 3 locating pegs at I that are fixed to the main body and run in slots in the cylinder. These prevent any loading being applied to the bellows. A cosmetic cylindrical cover J covers the slots and pegs. The end of the main body A has two O-rings around its circumference which bear onto the cylinder to provide further support and location. In order to control the tilting of the arm caused by the orthogonal adjusters at F, a PTFE ring is fixed in the main body at K and bears on the optical arm that runs through its centre. This ring defines the pivot point about which the arm moves when tilted.

The optical bench assembly 32 onto which all optics are mounted is bolted to the end of the mirror arm C and is fixed in relation to the parabolic reflector. When the arm is tilted, the bench therefore moves with respect to the microscope but not the parabola. To reduce the torque on the microscope and to minimise size, the bench returns along the length of the arm and is supported by a single bearing at M, in the form of a sprung ball. This bearing is positioned on the same vertical axis as the PTFE ring at K and so defines an axis about which horizontal tilts take place. Ideally we would provide more support for the optical bench at the microscope end but this was not possible without constraining the tilt. The 45° mirror 29 steers light from the parabolic mirror to the level off the optical bench. The further mirror 36 deflects the light onto the bench.

The bellows are made from stainless steel. All other parts are aluminium except the arm C which is also stainless steel for rigidity and ease of fabrication. The edge welded bellows has standard knife edge seals on the flanges at each end. Reusable, viton seals are used in these flanges rather than copper gaskets.

The sensitivity of adjustments is determined by the pitch of the screw threads on the adjustors at F. The threaded collar G has 2.5 mm pitch on both ends giving 5 mm of lateral movement per rotation or 14 $\mu$m per degree. The adjusters at F are 0.5 mm pitch giving about 1.4 $\mu$m per degree movement at the collar. This will translate to a similar sensitivity at the parabola although the exact amount will depend on the length of the arm and its degree of extension.

It was mentioned above that the optical system 30 moves in and out with the mirror 18, to preserve the alignment. If it is desired to use a fixed optical system, the arm assembly 22 could be arranged to bias the optical arm C into a kinematic support in the operative position.

Figure 2:
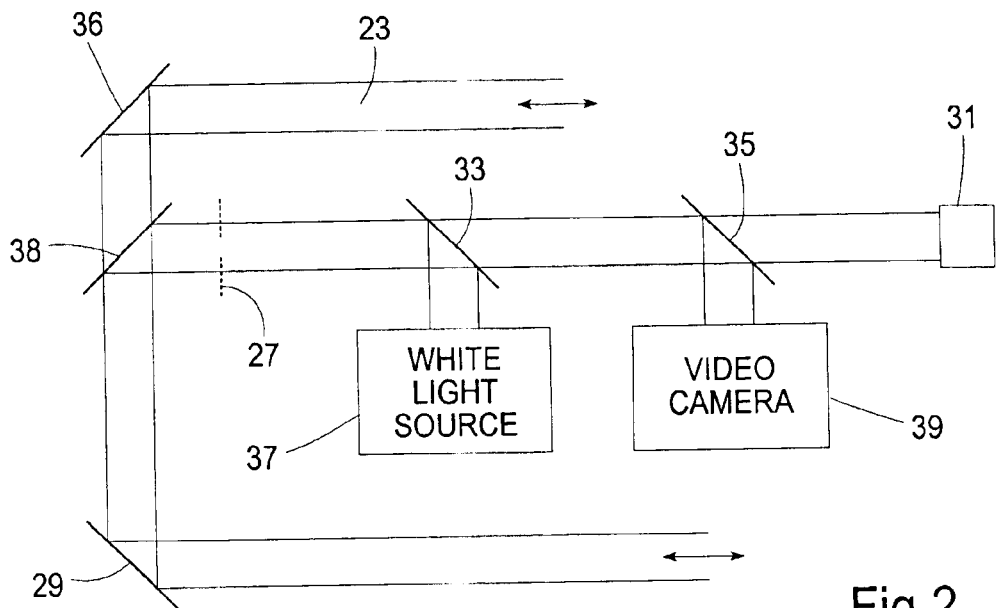
FIG. 2 is a schematic diagram of an optical system.

FIG. 2 shows the mirrors 29,36 in the optical path 23 between the arm assembly 22 and the optical system 30 on the bench 32. In addition, mounted on the bench is a retractable mirror 38 which can be placed in the optical path. Where cathodoluminescence is produced by the electron bombardment of the sample, this can be detected by inserting the mirror 38 to direct the cathodoluminescence towards an optical fibre connector 31, also on the bench. This includes a focusing lens for focusing the light onto a large aperture optical fibre. The use of a large aperture fibre permits the receipt of cathodoluminescence from a wide field of view on the sample 16, not merely from the focal point of the parabolic mirror 18. Typically, a 6 mm focusing lens and a 100 $\mu$m fibre may be used to give a 100 $\mu$m field of view at the sample. Thus, the electron beam can be scanned over that field of view and all the resulting cathodoluminescence collected.

The cathodoluminescence output from the optical fibre connector 31 is taken to a suitable detector arrangement. This may comprise a tunable filter for selecting a desired wavelength of cathodoluminescence, followed by a photomultiplier or avalanche photodiode. The output of the photomultiplier or avalanche photodiode is taken to a computer, which produces a two-dimensional map of the cathodoluminescence in a conventional manner, by processing the output in real time in synchronism with the scanning of the electron beam system 12 of the scanning electron microscope.

If desired, beamsplitters 33,35 may also be placed between the mirror 38 and the fibre connector 31. The mirror 33 permits injection of white light from a source 37, to illuminate the sample 16. The sample may then be viewed by a video camera 39, e.g. a CCD camera, via the beamsplitter 35, in order to assist setting up the sample and correlation of features found by the electron microscope and/or spectroscopy systems.

When the sample is illuminated by the white light source 37, a stop 27 may be provided in the beam path (e.g. an adjustable iris). This reduces the beam diameter in order to reduce spherical aberrations caused by the parabolic mirror 18.

The retractable mirror 38 may if desired be replaced by a beamsplitter permanently located in the optical path. However, this has the disadvantage that some of the inelastically scattered light is lost in the beamsplitter and does not pass back along the optical path 23.

The arrangements for injection of laser light and rejection of Rayleigh scattered light will now be described.

Figure 3:
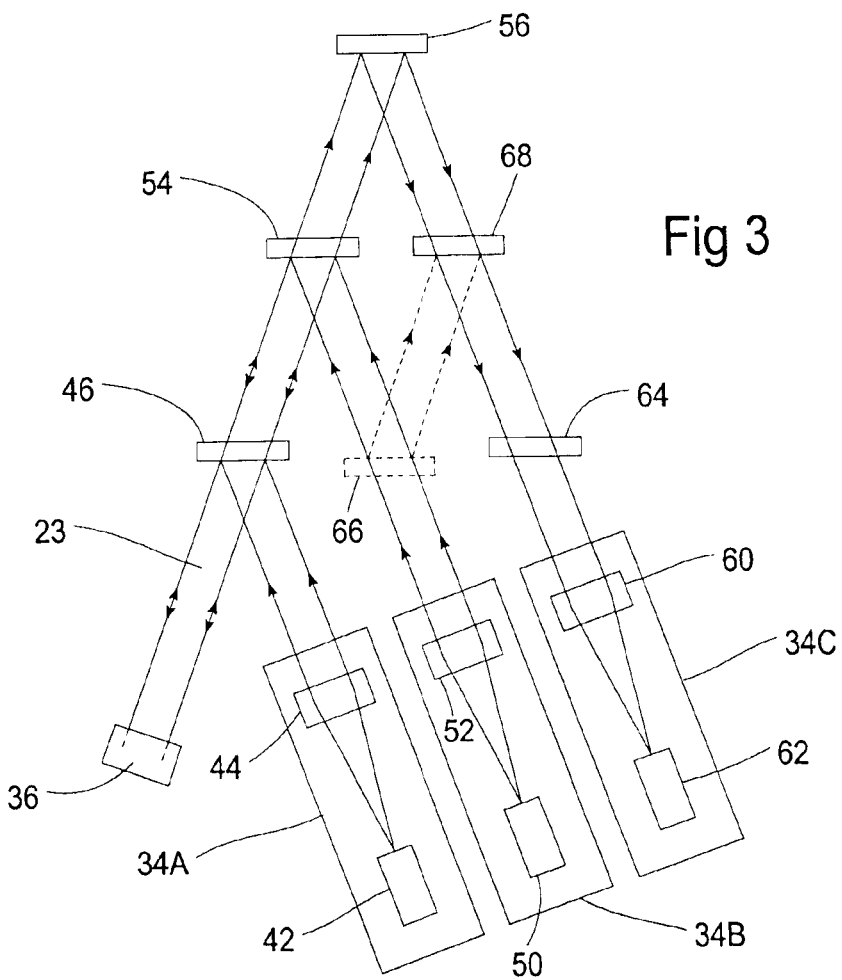
FIG. 3 and FIG. 4 are alternative schematic layouts of light injection and rejection systems for use with the system of FIG. 2.

FIG. 3 shows a plan view of the optical path 23, shown in elevation in FIGS. 1 and 2. Laser light at a first, lower wavelength, such as blue or green, e.g. 514 nm is injected through an optical fibre via the fibre connector 34A of FIG. 1. This comprises a mount 42 for the optical fibre and a collimating lens 44. This is directed at a holographic notch filter 46, located in the optical path 23 at a low angle of incidence such as 10°. The holographic notch filter 46 is designed to reflect the input laser beam at 514 nm. This then passes along the optical path 23 to the electron microscope shown in FIG. 1.

Similarly, for excitation at a longer wavelength, e.g. red or infra-red light at 785 nm, there is provided the fibre connector 34B, comprising a fibre mount 50 for an optical fibre delivering the red or infra-red laser light, and a collimating lens 52. The red or infra-red laser light is directed to a holographic notch filter 54 in the optical path 23. This is configured in the same way as the holographic notch filter 46, except that its notch is designed to reflect the incoming light at 785 nm.

The system can be used in various modes, as follows.

For examining a sample such as, say, a semiconductor, a 514 nm laser can be connected up to the connector 34A, in order to illuminate the sample 16. Raman scattered light on the Stokes side of the laser line is then passed back via the optical path 23, and passes straight through the filter 46. This filter rejects Rayleigh scattered light having the wavelength 514 nm. The Stokes Raman scattered light (up to about 5000 $cm^{-1}$) will then pass straight through the filter 54 undisturbed, because the 785 nm notch in this filter lies beyond 5000 $cm^{-1}$. It is then reflected by a mirror 56 towards the third fibre connector 34C, again comprising a focusing lens 60 and fibre mount 62. On the way, it may optionally pass through a further holographic notch filter 64, designed to reject more of the Rayleigh scattered light at 514 nm.

The light output from the fibre connector 34C is taken via an optical fibre to an appropriate spectrometer for analysis, e.g. a Renishaw Mk III Raman Spectrometer.

If it is desired to analyse inelastically scattered light such as photoluminescence which extends beyond 5000 $cm^{-1}$ from the laser line, then it will be appreciated that some of this light will be rejected from the optical path by the 785 nm notch filter 54. This light is recovered as follows. A movable mirror 66 is moved in between the filter 54 and the optical fibre connector 34B, and receives the desired light which has been rejected from the optical path 23 by the filter 54. It reflects it to a further holographic notch filter 68, designed to reflect light at 785 nm but pass all other light. This further holographic notch filter 68 recombines the light rejected by the filter 54 with the rest of the light passing from the mirror 56 towards the fibre connector 34C. Thus, the full range of wavelengths of photoluminescence is passed to the spectrometer for study.

Another mode of operation is as follows. This is suitable for, say, organic and biological materials, polymers, photo resist etc.

Many such materials have the problem that any Raman scattered light can be masked by fluorescence. This is overcome by using a longer excitation wavelength, e.g. 785 nm, injected by an optical fibre connected to the fibre connector 34B (with the mirror 66 moved out of the way). This excitation light in reflected by the holographic notch filter 54 and passes straight through the filter 46 along the optical path 22 towards the sample 14. Returning Raman scattered light again passes unaffected through the filter 46. It is transmitted by the filter 54, which rejects the Rayleigh scattered light at 785 nm. The Raman scattered light is reflected by the mirror 56, and passes through the second 785 nm holographic notch filter 68 which performs further Rayleigh rejection. It is then taken to the spectrometer as before, via the optical fibre connector 34C.

One problem of the system of FIG. 3 is that the mirror 66 must be moved when changing from one operating mode to another. Although alignment of this mirror is not very difficult (since it does not affect the focusing of the laser beam) nevertheless it would be desirable to produce a system which does not require such adjustment by the user. An example of such a system is shown in FIG. 4.

Figure 4:
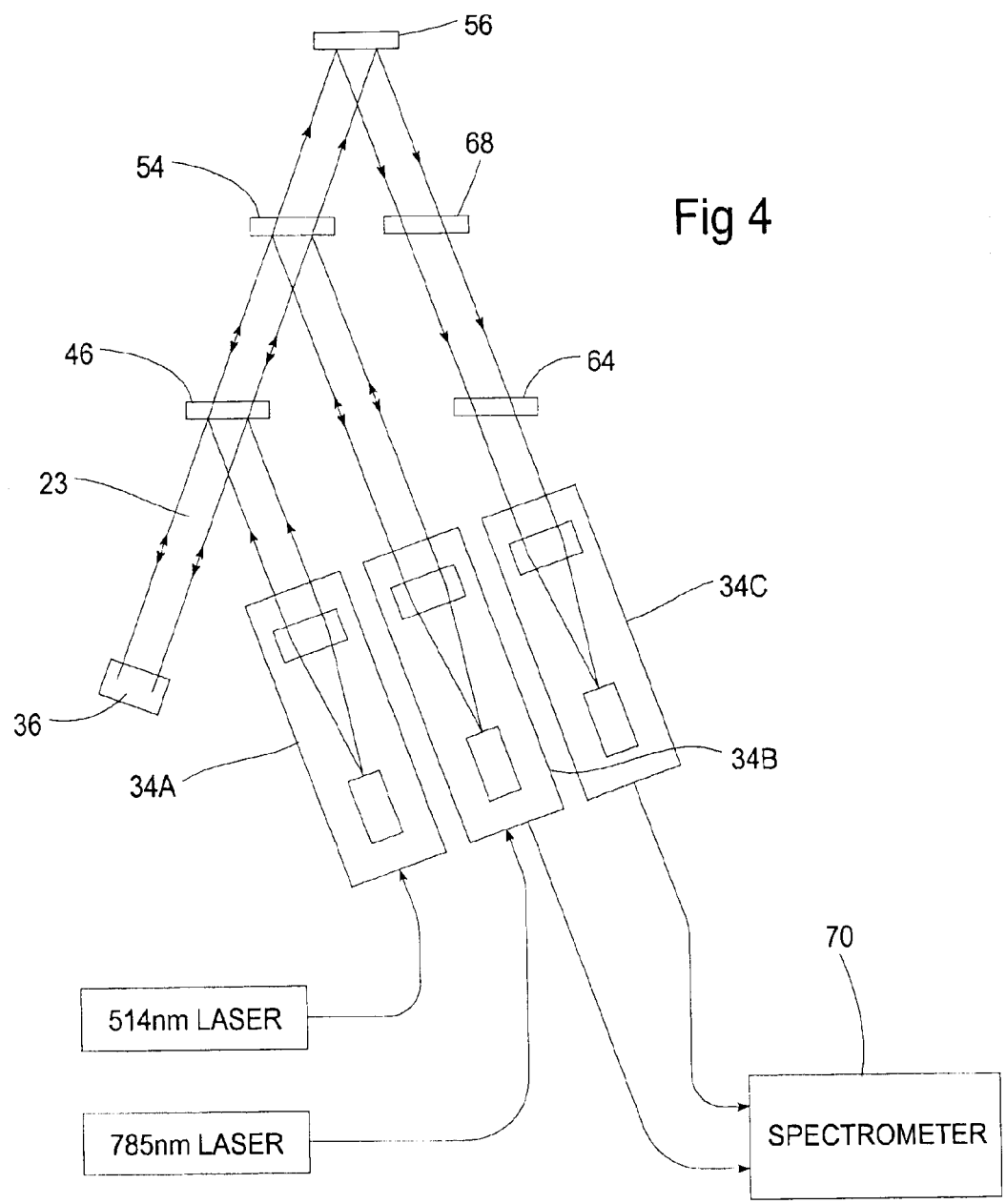

In FIG. 4, the components are similar to those shown in FIG. 3. They have therefore been given the same reference numerals and their description will not be repeated.

However, FIG. 4 does not feature the movable mirror 66. Instead, the optical fibre connector 34B fulfils two different roles in the two different operating modes. When using the longer (785 nm) excitation wavelength, it is fed to the optical fibre connector 34B as in FIG. 3. However, when using the shorter (514 nm) excitation wavelength via the optical fibre connector 34A, the filter 54 will reject photoluminescence and other inelastically scattered light at around 785 nm. This passes to the optical fibre connector 34B. In this mode, therefore, both the optical fibre connectors 34B and 34C are used for outputs from the system. They may be taken to separate spectroscopy and detection systems, and the results recombined in a computer which receives the outputs of both. Ideally, however, they are taken as two separate inputs to a Renishaw Mk III Raman System at 70. That system has the ability to receive multiple optical fibre inputs, and to disperse the respective spectra from these inputs at spaced positions on a common CCD detector. The outputs are then read from the CCD and again recombined within the computer. Alternatively they may be binned together on the CCD chip.

When recombining the signals, the computer can normalise them by multiplying them by an appropriate factor. This allows for the fact that the different signals have passed through different numbers of optical components and will therefore have suffered different amounts of attenuation. It also compensates for differences of intensity caused by the focusing of the light onto the optical fibres, and the optical fibre alignments.

For the laser inputs, we prefer to use single mode optical fibres connected to the connectors 34A,34B. This enables confocal operation, with the illuminated spot on the sample 16 being confocal with the ends of the delivery fibres. The output fibres connected to the connector 34C (and the connector 34B in FIG. 4) may be single mode or multimode; multimode fibres are easier for broad band collection.

If desired, cathodoluminescence may be collected, without laser excitation, by connecting output optical fibres to all three of the fibre connectors 34A,B,C. In this case, the optical fibre connector 34A collects light rejected in the 514 nm notch filter 46. Again, the signals may be recombined after separate detection, or in a Renishaw Mk III Raman System.

An advantage of both FIG. 3 and FIG. 4 is that the user does not need to replace and realign the holographic notch filters when changing laser excitation wavelength. He simply has to reconnect the optical fibre connectors 34A,B,C in the appropriate manner.

The arrangements of FIGS. 3 and 4 may of course be used separately from the electron microscope system shown in FIG. 1. For example, the optical path 23 in FIGS. 3 and 4 may lead to a conventional optical microscope, in the manner shown in EP 543578. It may then be used for analysis of Raman, photoluminescence, etc light from a wide variety of samples. For example, in order to study Raman and photoluminescence from III–V semiconductor materials based upon gallium nitride, visible laser excitation may be provided via the connector 34B and UV laser excitation via the connector 34A, the holographic notch filters 46,54 being selected accordingly. Such materials are valuable because they are luminescent in the blue region of the spectrum, and the UV excitation enables study of their photoluminescence.

Other dichroic filters may be used in place of the holographic notch filters. For example, they may be edge filters or bandpass filters, and they may be dielectric or Rugate filters instead of holographic.

Three or more excitation wavelengths may be made available, if desired, by providing one or more further optical fibre connectors. One or more further notch filters are placed in series with the optical path 23, in the same way as the filters 46,54, the notches of these further filters corresponding to the extra excitation wavelengths.

Figure 5:
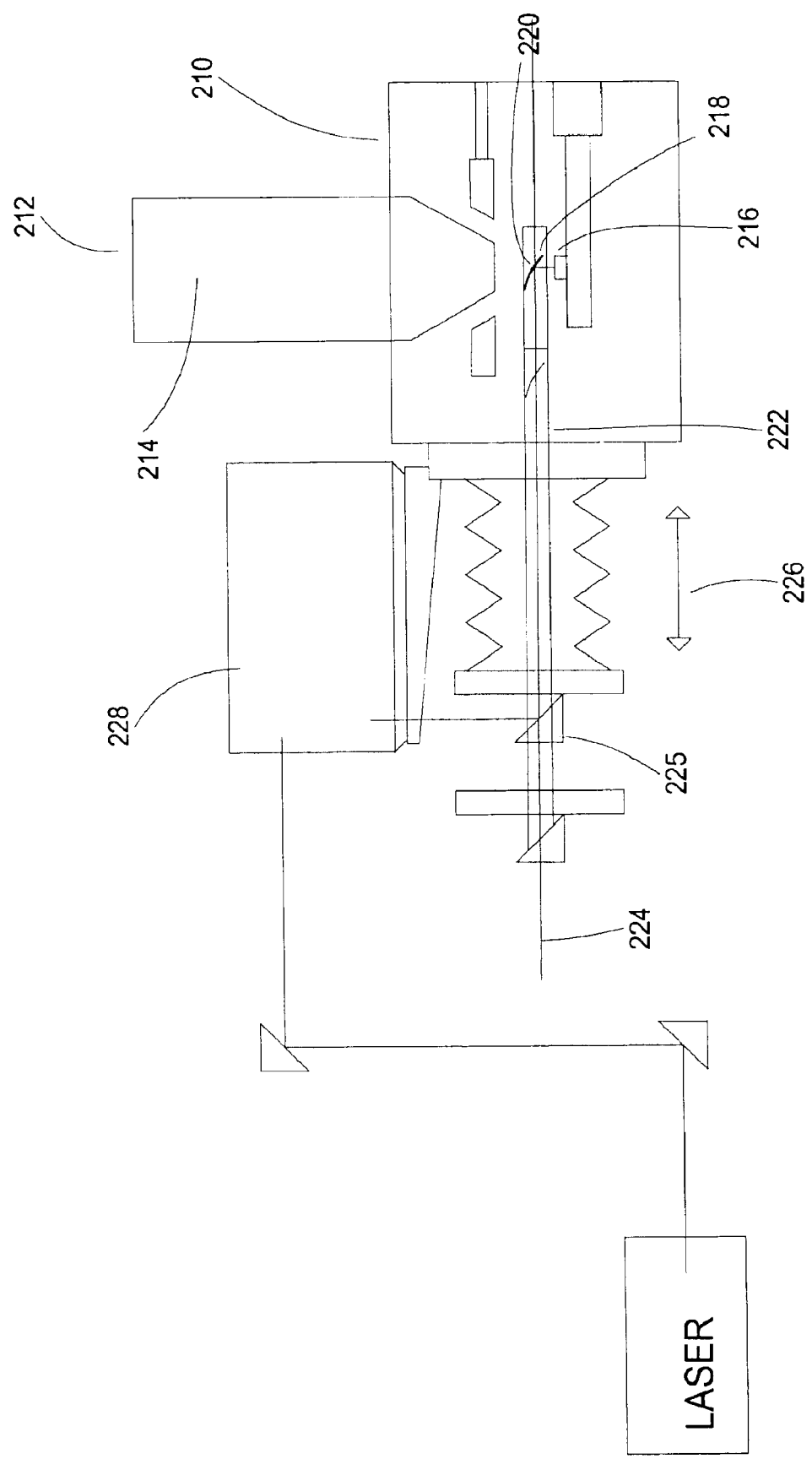
FIG. 5 is a schematic illustration of a scanning electron microscope coupled with a spectroscopy system.

FIG. 5 shows a scanning electron microscope 210 according to a second embodiment of the invention with a conventional electron beam generation, focusing and scanning system 212. This projects a beam of electrons generally along an analytical axis 214 to a sample 216 in a well-known manner.

In place of a scanning electron microscope the invention may also be used with other types of analytical system including transmission electron microscopes and also with apparatus such as ion beam bombardment systems.

A parabolic or other concave mirror 218 is mounted generally on the axis 214 above the sample 216 and has a central aperture 220 so that the electron beam may pass through to the sample 216. The parabolic mirror 218 is mounted on a mirror holder arm 222 having an optical axis 224 which is generally transverse to the analytical axis 214 of the scanning electron microscope. The mirror holder 222 is able to retract the parabolic mirror 218 as shown by double-headed arrow 226 between an operative position (shown by the solid line) and an inoperative position (shown by the dashed line). In the inoperative position the parabolic mirror 218 does not interfere with other equipment within the scanning electron microscope such as an x-ray detector which can be used to detect x-rays generated by the bombardment of the sample 216 with the electron beam.

An optical system 228 which may for example comprise a spectrometer, is also provided in the system. An input laser beam 227 may be directed via a mirror 225 or other means along the optical axis 224 and focused onto the sample 216 by the parabolic mirror 218 when it is in the operative position. The laser light may be UV, visible or IR, for example. Scattered light from the sample 216 is collected and collimated by the parabolic mirror 218 and fed back in the return direction along the optical axis 224 towards the optical system 228. The collected light may be inelastically scattered light such as Raman, or fluorescence or photoluminescence. It will also include elastically scattered (Rayleigh) light at the laser wavelength. Alternatively, or additionally, the light collected from the sample 216 by the mirror 218 may be cathodoluminescence, generated by the action of the electron beam on the sample 216 without the need for a laser input.

FIG. 1 shows a system in which the optical system 228 is fixed rigidly with respect to the scanning electron microscope chamber. In this case the parabolic mirror must locate precisely with respect to both the optical system and the electron beam each time the parabolic mirror is put into the operative position. In an alternative arrangement, the optical system may be fixed rigidly with respect to the parabolic mirror, the whole system retracting together. This arrangement has the advantage that the parabolic mirror only needs to locate precisely with the electron beam but has the disadvantage that the heavy and bulky spectrometer and laser of the optical system, or parts associated with signal collection and laser delivery, must be supported by the mirror holder arm assembly.

Figure 6:
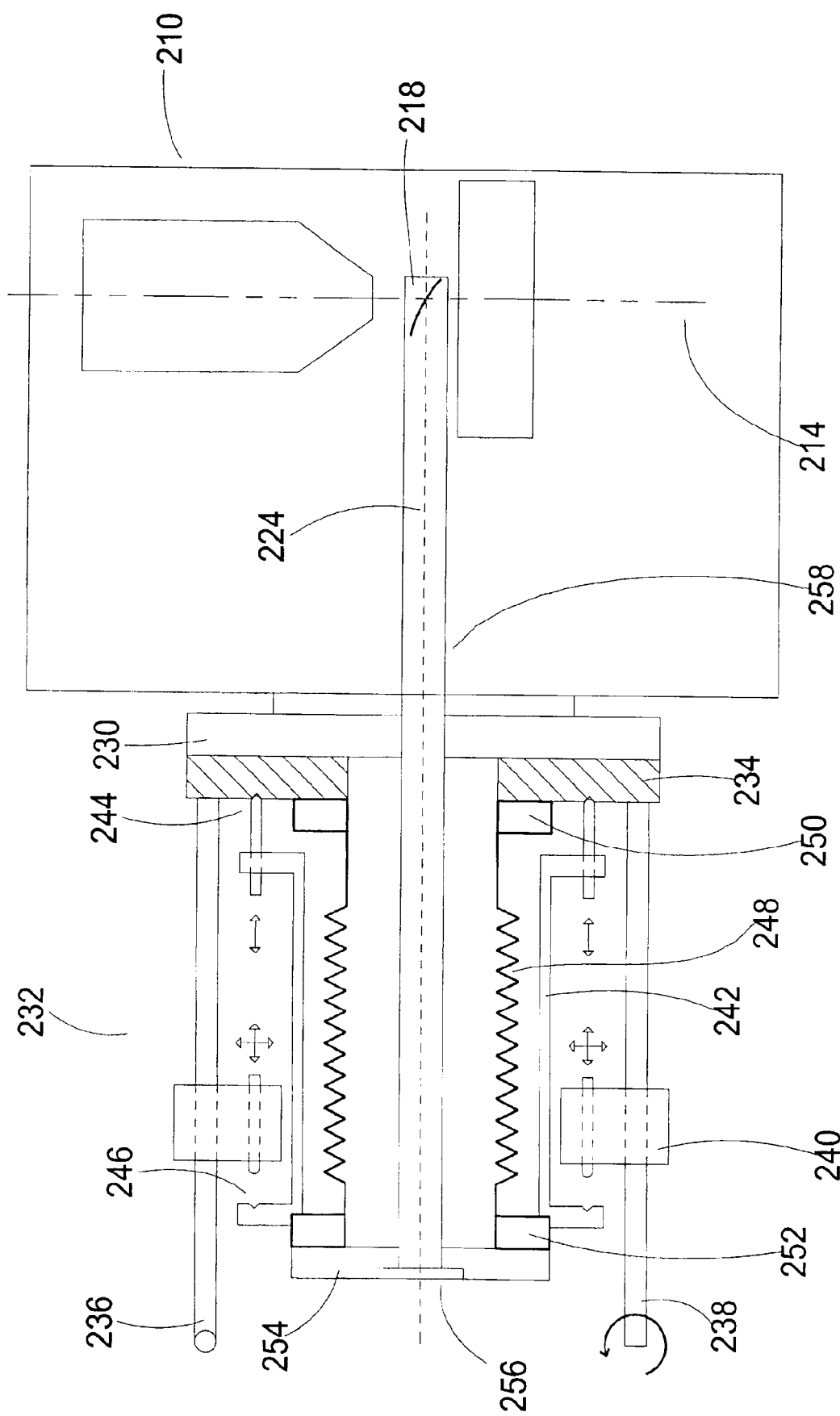
FIG. 6 is a schematic illustration of the retraction mechanism of FIG. 1.

The functional elements of the retraction mechanism are shown in FIG. 6. The scanning electron microscope is provided with a chamber flange 230 on the wall of the scanning electron microscope chamber 211. The retraction mechanism 232 is mounted to the scanning electron microscope chamber flange 230 via a mechanism flange 234. When the mechanism flange 234 is mounted to the scanning electron microscope chamber 211 it is fixed with respect to the electron beam axis 214, thus all critical optical and mechanical locations are referenced to this mechanism flange 234.

A pair of guide-rails 236 (only one shown) and a retraction screw 238 are mounted on the mechanism flange 234. A retraction arm 240 is mounted on the guide rails 236 and may be wound in or out along the guide-rails 236 by the retraction screw 238, which may be motor-driven.

A sliding tube 242 indirectly carries the parabolic mirror 218 and may be mounted concentrically with the retraction arm 240 about the optical axis 224. The position of the sliding tube 242 and thus the parabolic mirror 218 is defined by two sets of mounts, comprising adjustable kinematic mounts, these are the location mount 244 and the retraction mount 246. The retraction arm 240 is wound in or out along the guide-rails 236 to push the sliding tube 242 onto the location mount 244 (i.e. with the parabolic mirror in the inserted position) or onto the retraction mount 246, (i.e. with the parabolic mirror in the retracted position). A bellows seal 248 is used to create a vacuum seal capable of linear movement. This type of seal has the advantage that it allows tilt, a slight amount of rotation and lateral movement and is a reliable seal down to ultra high vacuum pressures. Alternative seals, such as a sliding o-ring seal could also be used.

The bellows seal has a bellows fixed flange 250 at one end and a bellows travelling flange 252 at the other end. The bellows fixed flange 250 is mounted to the mechanism flange 234 adjacent the scanning electron microscope chamber 210. The bellows traveling flange 252 is mounted to both an optics flange 254 and the distil end of the sliding tube 242 from the scanning electron microscope chamber 210. The optics flange 254 provides a vacuum window 256 for light extraction and also holds a mirror holder arm 222 which supports the parabolic mirror 218 in the scanning electron microscope chamber 210.

The retraction arm 240 may be used to push the sliding tube 242 towards the scanning electron microscope chamber 210 where its position is defined by a location mount 244.

The retraction arm may also push the sliding tube 242 away from the scanning electron microscope chamber 210 such that its position with respect to the retraction arm 240 is defined by a retraction mount 246 both during retraction and in the retracted position. The position of the sliding tube 242, and thus the parabolic mirror 218, is always defined by either the location or retraction mounts 244,246.

Figure 7:
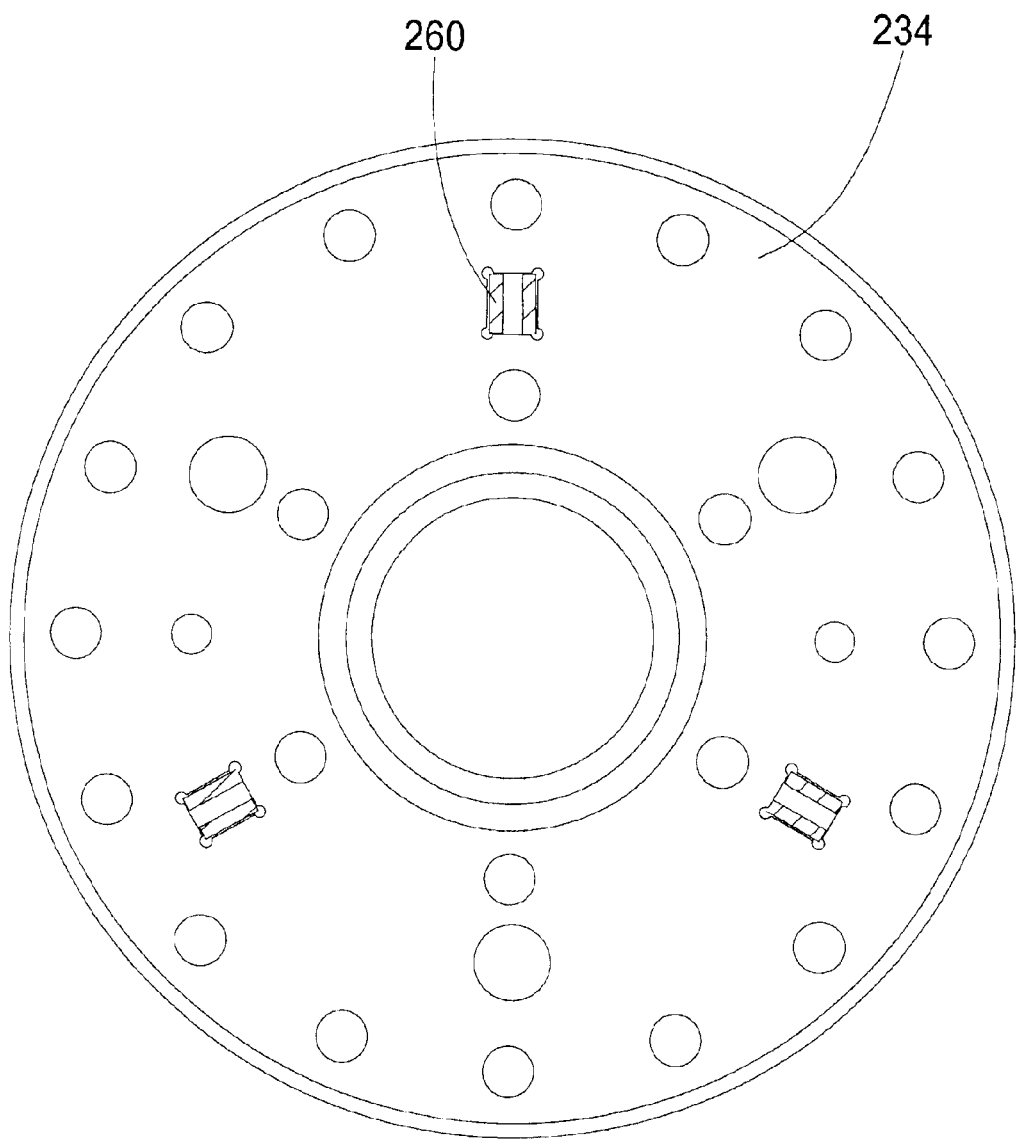
FIG. 7 is an end view of the mechanism flange of the retraction mechanism.

The kinematic mount at the location mount 244 comprises three v-shaped grooves spaced at 120° apart on a circle concentric with the optical axis 224 on the mechanism flange 234 of the retraction mechanism 232. These are provided on a face of the mechanism flange 234 adjacent the sliding tube 242. Each v-shaped groove may be provided by a pair of parallel cylindrical rollers 260, as shown in FIG. 7. Three similarly spaced ball-ended bearings are provided on a face of the sliding tube adjacent the mechanism flange 234. As the sliding tube 242 is carried towards the mechanism flange 234 the ball bearings interact with the v-shaped groove to accurately define the position of the sliding tube 242 against the mechanism flange 234 and hence the position of the parabolic mirror 218.

The vacuum in the scanning electron microscope chamber holds the sliding tube in position against the mechanism flange and thus other methods of holding the kinematic elements together, such as by magnetic attraction or springs, are not required.

It is desirable for the kinematic mount to be adjustable and for that adjustment to be possible ex-vacuo. In this example the position of each ball-ended bearing is adjustable parallel with the optical axis 224. As shown in FIGS. 8 and 9 each ball-ended bearing is provided by a cylindrical rod 262 with a rounded end 264. Each cylindrical rod 262 is housed in a housing 266 located in the sliding tube 242. The housing 266 has a central aperture 268 running along its longitudinal axis. This aperture is stepped having a wider portion 270 and a narrower portion 272. The cylindrical rod 262 fits into the wider portion 270 with the step 274 into the narrower portion 272 acting as a stop. The cylindrical rod 262 is held in position in the housing 266 by a screw 276 inserted through an aperture 278 in the side of the housing 266 which pushes against a flattened portion 280 on one side of the cylindrical rod 262. The rounded end 264 of the cylindrical rod 262 extends out of the central aperture of the housing 266.

The exterior of the housing 266 also has a stepped cylindrical profile. The external surface of the narrower portion 282 of the housing is threaded and is screwed into a threaded aperture 284 in the sliding tube 242 and held in position by a bolt 285. The narrower portion 272 of the internal surface of the housing 266 is also threaded and receives an adjustment screw 286 which allows the position of the housing 266 to be adjusted along its longitudinal axis with respect to the sliding tube 242.

The ball-ended bearings are individually adjustable in position parallel to the optical axis 224. The mirror holder arm 222 can thus be tilted about each of three axes at 60° to each other by individual adjustment of the ball bearing positions. The optic arm 258 can also be translated parallel to the retraction axis by collective adjustment of the ball-ended bearing positions. These alignments are sufficient to position the parabolic mirror 218 in three dimensions with respect to the scanning electron microscope axis 214.

The rounded end of the scanning electron cylinder 264 has two points of contact with the v-shaped groove. Another shape also having two points of contact with the vee-shaped groove may be used, for example the wedge shape shown in FIG. 10. The wedge may, for example, have an angle of 60°.

To retract the parabolic mirror 218, the retraction arm 240 is wound into contact with the far end of the sliding tube 42 from the scanning electron microscope chamber 210 and the whole mechanism is withdrawn away from the mechanism flange 234. The contacts at the location mount 244 are broken and the position of the parabolic mirror 216 during retraction is defined by the retraction mount 246. Retraction of the parabolic mirror is limited by an adjustable stop (not shown) on the retraction screw.

The contact between the retraction arm 240 and the sliding tube 242 is by an adjustable kinematic mount similar to that of the location mount 244 in which the ball-ended bearings are located on the retraction arm 240 and are in contact with v-shaped grooves on the sliding tube 242.

Figure 11:
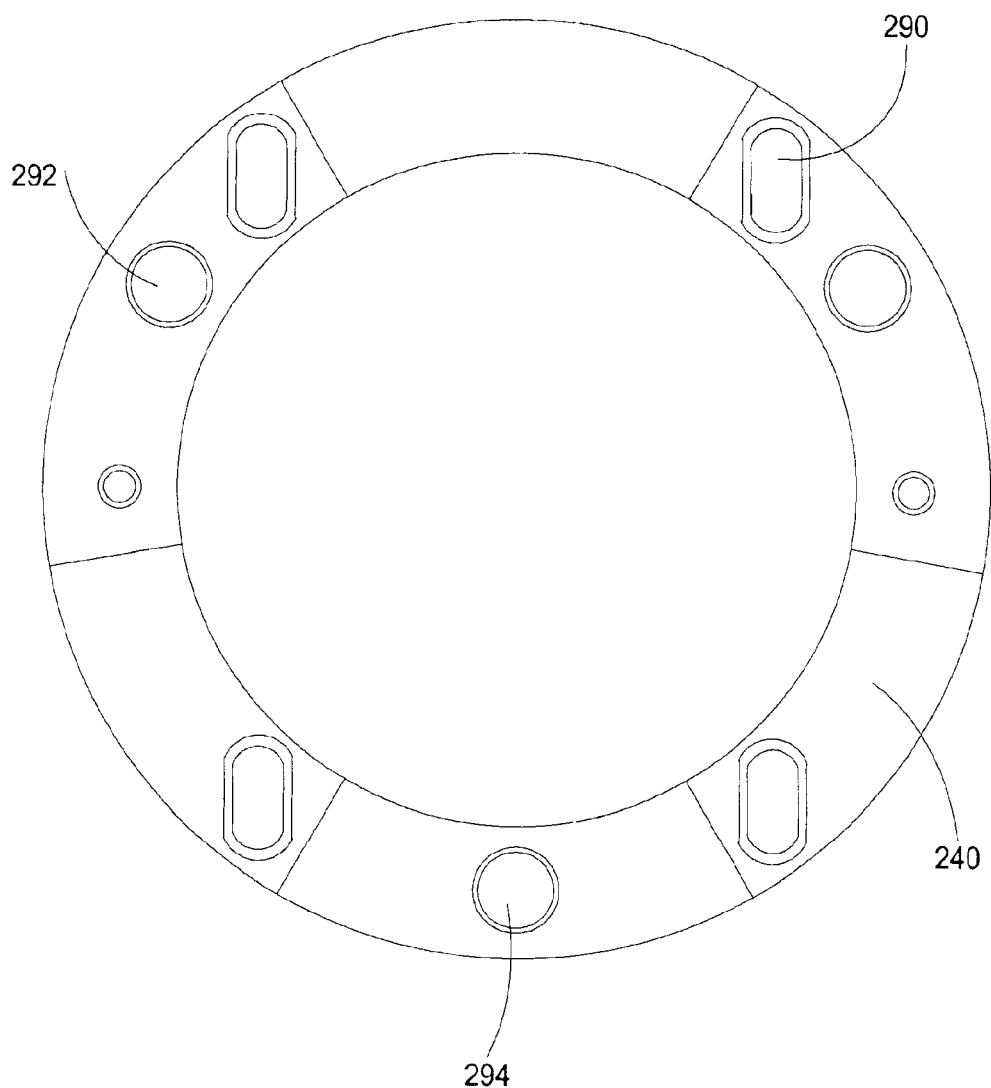
FIG. 11 is an end view of the retraction arm of the retraction mechanism.

FIG. 11 shows an end view of the retraction arm. Apertures 292 are provided for the guide rails and a threaded aperture 294 is provided for the retraction screw. Four elongate apertures 290 are provided into which the housings for the ball-ended bearings are located. These elongate slits allow lateral adjustment of each housing individually.

The position of the sliding tube 242 and therefore the parabolic mirror 218 is thus always defined by either the location mount 244 (i.e. with respect to the mechanism flange 234) or by the retraction mount 246 (i.e. with respect to the retraction arm 240).

After the alignment of the parabolic mirror 218 has been set by adjustment of the kinematic mount at the location mount 244, the kinematic mount of the retraction mount 246 is adjusted so that the plane of its ball bearings is parallel to that of the location mounts. It is also adjusted laterally to ensure that the ball bearings align with the v-shaped grooves, thus compensating for any lateral displacement of the sliding tube 242 with respect to the retraction arm caused by the tilt adjustment of the location mount 244. These adjustments serve to minimise any movement of the parabolic mirror 218 during the transition from engagement of the location mount 244 to engagement of the retraction mount 246 and are only required after changes to the alignment of the parabolic mirror 218 by adjustment of the location mount 244.

The adjustable kinematic mount of this invention is suitable for use in other applications. For example, a fibre optic light collection element, such as described in International Patent Application No. PCT/GB01/00170 may be positioned precisely between a sample and an objective lens of a defect review tool (DRT), a type of electron microscope for detecting defects in semi-conductor wafers. A detect in the wafer can be accurately positioned in the DRT to be at the electron optical centre and thus the fibre optic light collection element must also be moved precisely to the electron optical centre at a known distance from the sample surface. Thus the fibre optic light collection element must be accurately positioned in X,Y or Z which is achievable by use of the above described adjustable kinematic mounts.

This invention is not restricted to an adjustable kinematic location mount. Other adjustable mounts which constrain the position of the parabolic mirror 10 in six degrees of freedom are also suitable. Such mounts may comprise for example, a combination of balls abutting a plate to constrain some movement and a planar spring to constrain other movement, as disclosed in U.S. Pat. No. 4,451,987 and in U.S. Pat. No. 4,473,955.

Figure 12:
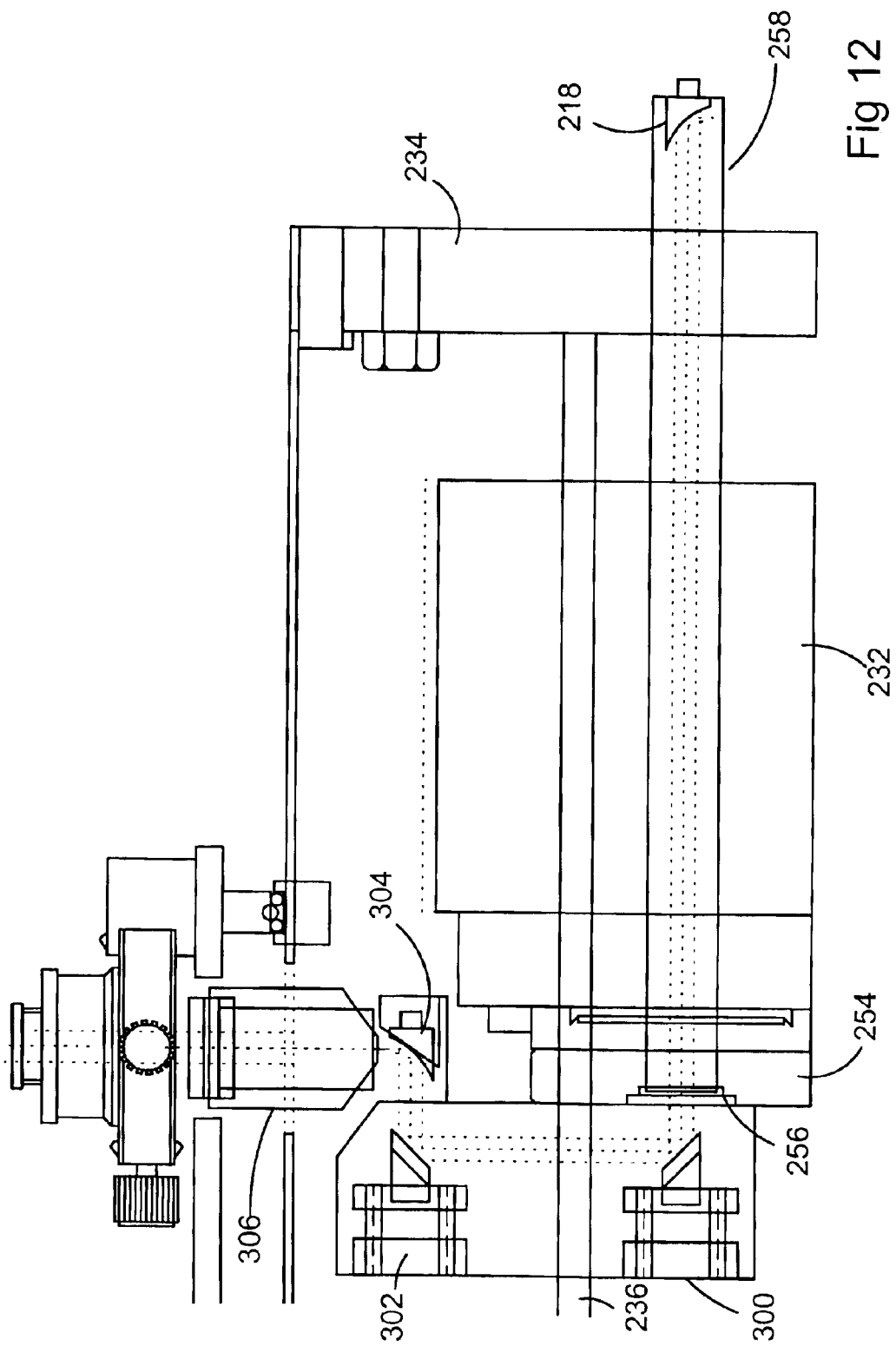
FIG. 12 is a schematic illustration of the optical arrangement between the scanning electron microscope and optical system.

FIG. 12 illustrates the optical arrangement which couples the light collected by the parabolic mirror 218 to an optical system, such as a spectrometer. The same reference numbers are used for identical parts seen in previous Figures.

Light collected from the sample by the parabolic mirror 218 is reflected to a second parabolic mirror 304 via adjustable mirrors 300,302. The two parabolic mirrors 218,304 are in a fixed relation to each other and their relative alignment can be adjusted in six axes by the two adjustable mirrors 300,302.

A microscope objective 306 is provided in a fixed position relative to the mechanism flange 234 of the retraction mechanism 232 (and hence the sample chamber). The microscope objective 306 is positioned at the focus of the second parabolic mirror 304 and collimates the light into a parallel beam suitable to be directed into a spectrometer. It is desirable for the microscope objective 306 to be adjustable to allow it to be accurately positioned at the focus of the second parabolic mirror 304.

Parabolic mirrors are used in preference to plane mirrors because they offer better light collection efficiency. They are used in preference to ellipsoids because these have twin foci which significantly complicates and sensitises the alignment.

An inevitable consequence of using a parabolic mirror is that the off-axis image is distorted. This is improved by using two parabolic mirrors. An even greater improvement is possible by using four parabolic mirrors, however this is at the expense of ease of alignment.

Although FIG. 12 shows a pair of parabolic mirrors 218,304 coupling light from the sample to the microscope objective 306 in conjunction with alignment mirrors 300, 302, systems using one or four parabolic mirrors in conjunction with alignment mirrors may also be used.

Figure 13:
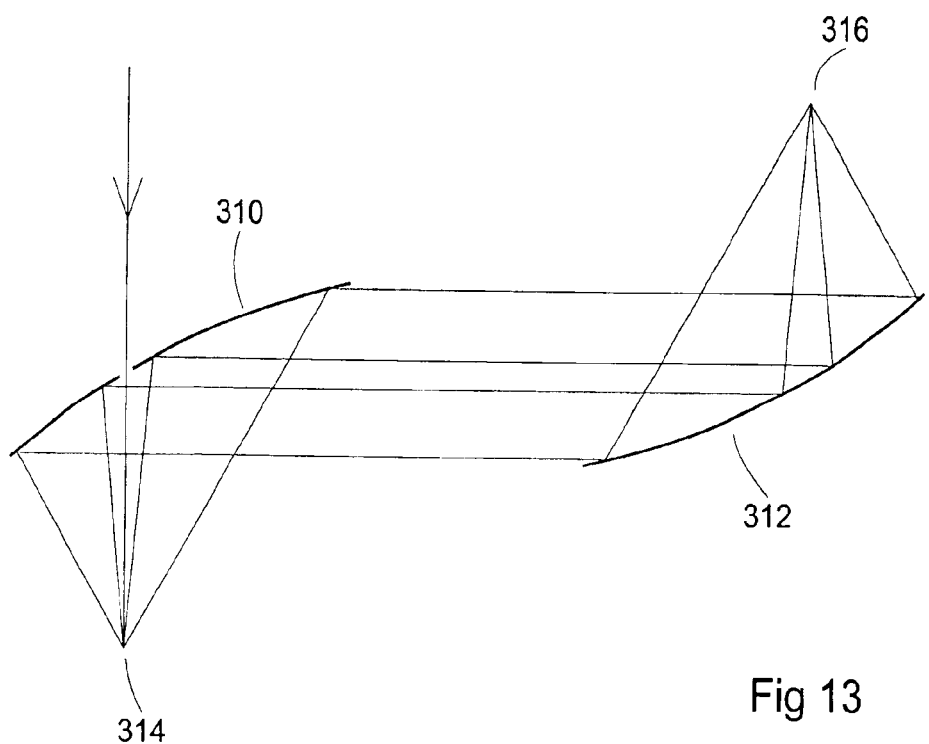
FIG. 13 shows prior art coupling of parabolic mirrors.

Use of parabolic mirrors for coupling a Raman laser probe to an electron microscope has been previously disclosed in "Raman Microscopy, Developments & Applications" by George Turrel & Jacques Corset. In this system a pair of parabolic mirrors 310,312 are arranged such that their foci 314,316 are in different horizontal planes, as shown in FIG. 13. This arrangement has the disadvantage that it does not cancel all aberrations.

Figure 14:
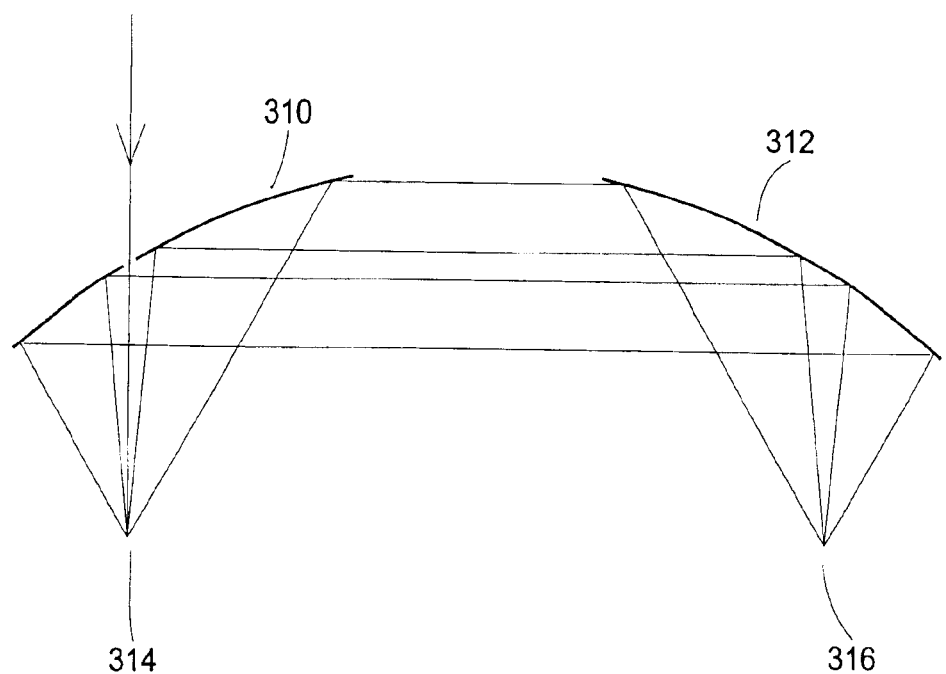
FIG. 14 shows coupling of parabolic mirrors as used in the present invention.

In the present invention, the parabolic mirrors are arranged with their foci in the same horizontal plane, as shown in FIG. 14. This configuration of the parabolic mirrors cancels the aberrations, in particular it corrects aberrations from paraxial rays.

Image processing techniques, such as image warping, are used to correct for residual distortion (such as pin-cushion or barrel distortion).

It is desirable to position the laser spot on the sample repeatably to an accuracy of better than 1 micron. However, if a non-kinematic location mount is used (for example an end stop or sliding bearing) or if the kinematic location mount is contaminated, by dirt for example, the accuracy of the spot position is reduced. Inaccuracies for the position of the laser spot on the sample may be compensated for by arrangement of the optics as described below.

Figure 15:
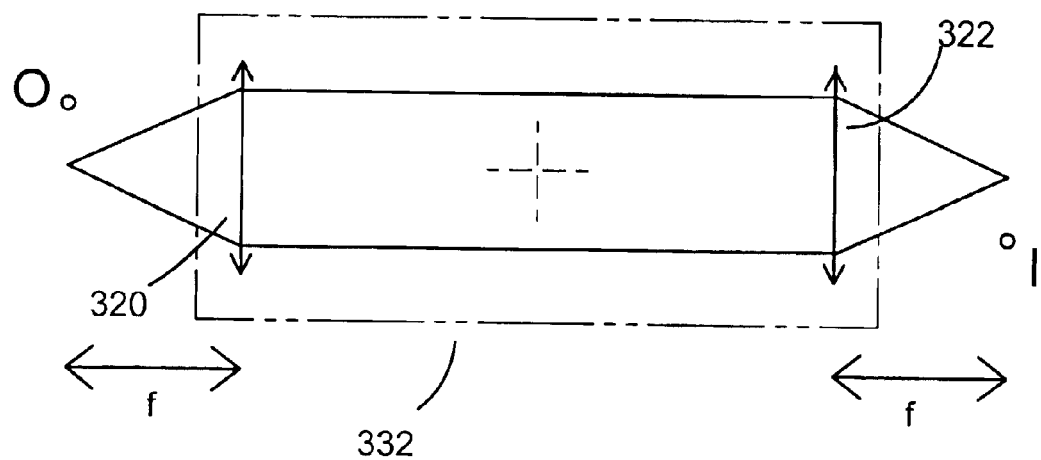
FIG. 15 is an illustration of two lenses in infinite conjugate mode.

FIG. 15 illustrates two identical lenses 320,322 of focal length f working in infinite conjugate mode. If the object O is moved upwards, the image I is inverted by the same amount. This property is used for compensation of small inaccuracies in position of the retraction arm.

Figure 16A:
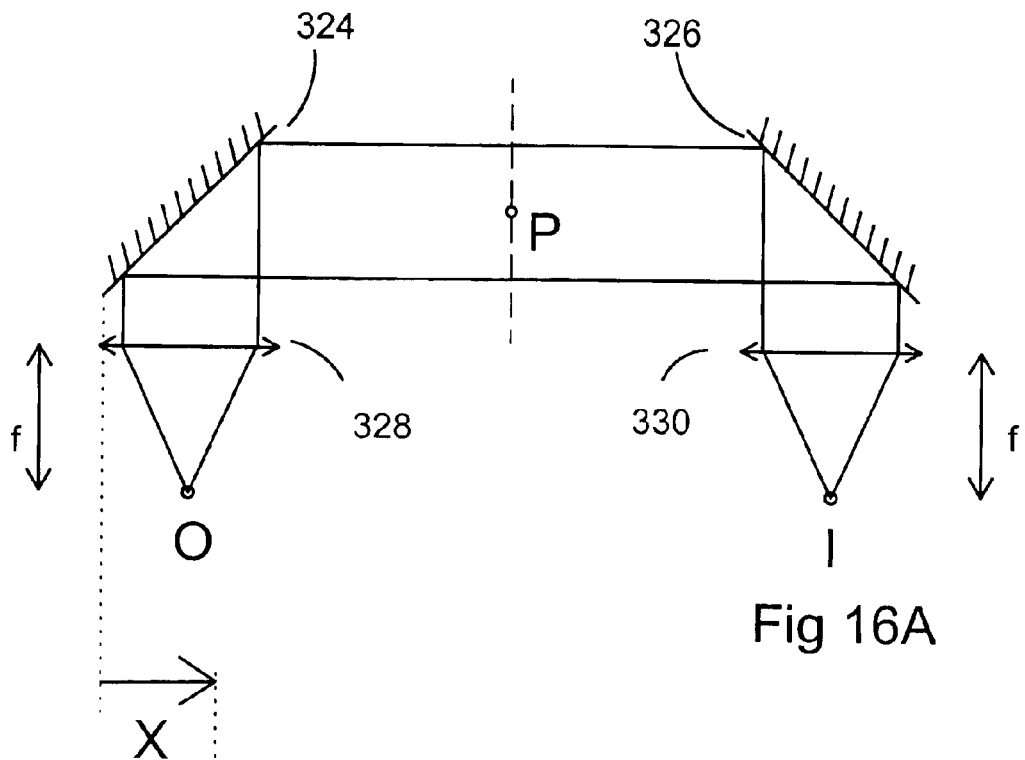
FIGS. 16A and 16B illustrate a simplified version of the optics in the retraction arm.

FIG. 16A illustrates a simplified version of the optics used in the retraction arm. Each set of optics may comprise a plane mirror 324,326 and lens 328,330. Alternatively, the optics may comprise, a pair of parabolic mirrors as illustrated in FIG. 12. The optics are rigidly mounted with respect to one another within the retraction arm, with the result that insertion/retraction of the retraction arm moves the whole optic assembly. In addition the optics are a matched pair, so that for a small area about the image/object planes the object will be imaged with a magnification factor of 1, be in focus and inverted.

FIG. 16A shows the two mirror and lens assemblies 324,328 and 326,330 having equal focal lengths f and being spaced equidistantly about a pivot point P (i.e. the location mount).

Figure 16B:
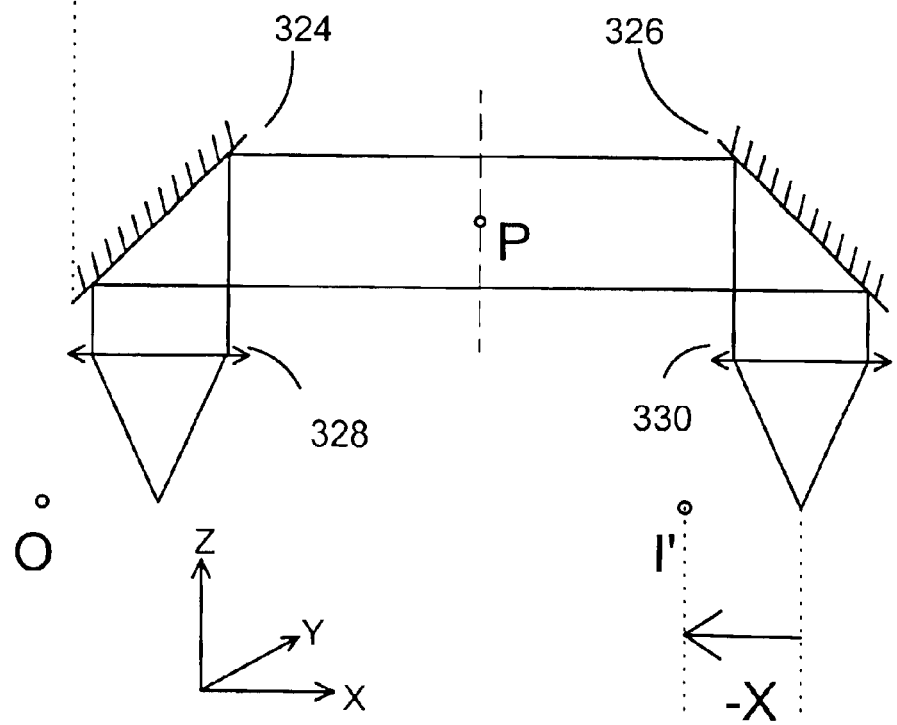

If, as shown in FIG. 16B the whole assembly is translated in the X direction whilst the position of the object O remains fixed, an image I' will be generated which is translated by −X with respect to the retraction arm. The position of the laser spot on the sample thus remains in the same position and is not effected by the slight movement of the retraction arm. The compensation as described above applies for translation of the retraction arm in X, −X, Y and −Y.

This system does not compensate for translation of the retraction arm in the Z direction in the same manner. However small changes of the retraction arm in the Z direction within the depth of field of the optical system do not cause a problem. The depth of field of a parabolic mirror used in this optical system is, for example, approximately 20 microns. As the aim is to position the spot within 1 micron, small movements of the parabolic mirror to this order are accommodated.

The symmetric arrangement of the optics also compensates for small rocking movements of the retraction arm. FIG. 15 shows two lenses 320,322 which are rigidly mounted with respect to one another, for example by a housing 332. If the object O is fixed and the housing is rocked about the pivot point P, then for small angles within the depth of field, the image I does not move. This is for the same reason as described above. However, this is only true if the pivot is at the centre of the two optics. The location mount of the retraction arm (kinematic or otherwise) acts as the pivot between the optics.

If the focal lengths of the lenses are not equal then the pivot point must be moved to a position closer to the lens with the longer focal length. For example, if the ratio of object lens focal length f1:image lens focal length f2 is 1:2, then the distance ratio of object to pivot point:pivot point to image must be 2:1.

Rocking of the retraction arm also causes movement in z but if the rocking angle is small and the distance from the pivot point to the object is large, then this will not effect the image.

Figure 17:
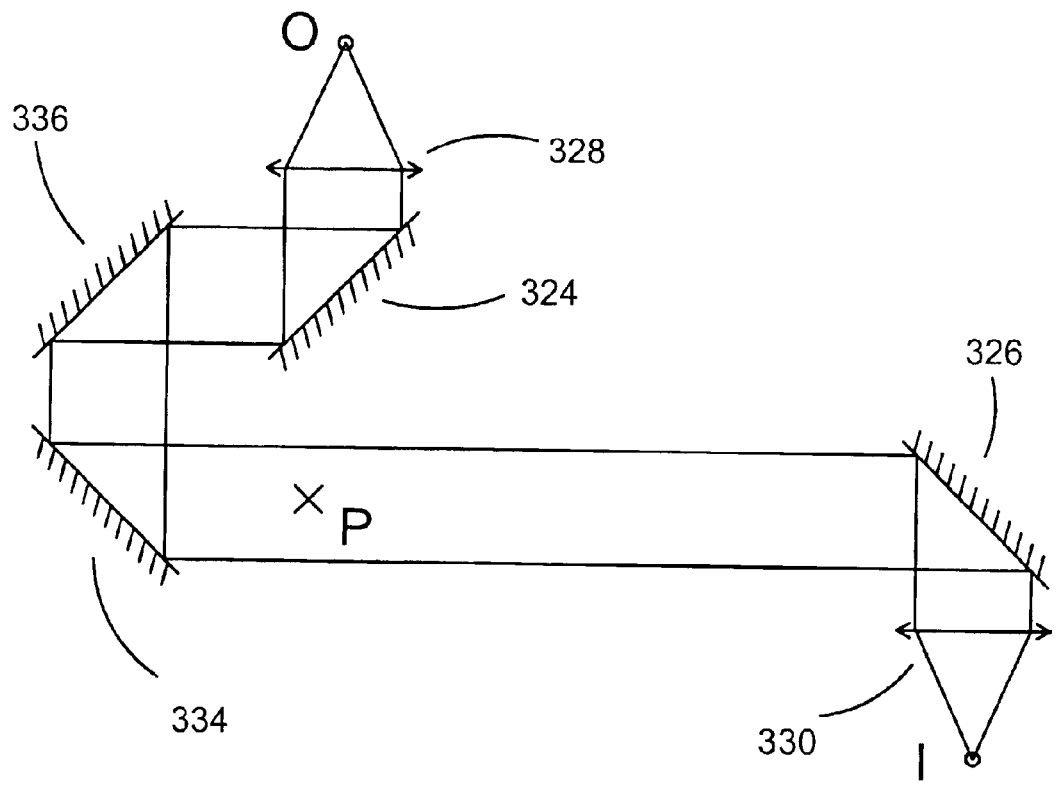
FIG. 17 illustrates optics within the retraction arm.

FIG. 17 illustrates an optical arrangement of the retraction similar to that shown in FIG. 12. This arrangement includes two mirrors 334,336 to fold the light path. The location mount forms a pivot P and, if the lenses 328,330 have equal focal lengths, is positioned equidistant from each mirror and lens assembly 324,328 and 326,330 along the light path.

The use of symmetry in the optics therefore provides correction for an inaccurate motion system. This optics arrangement allows a less accurate location mount to be used for stable and repeatable positioning of the retraction arm as small inaccuracies in the position of the retraction arm are compensated for.

In the case where the optics comprise a pair of parabolic mirrors, the degree of correction is a function of image quality across the image field and requires that these parabolic mirrors are identical, as discussed with reference to FIG. 14. Use of parabolic mirrors has the advantage that they provide better light collection and thus faster optics then the plane mirror and lens arrangement. In addition parabolic mirrors take up less space in the retraction arm and have a greater depth of field which allows for greater movement in z of the retraction arm.

What is claimed is:

1. An adapter for performing an optical analysis of a sample mounted in a sample chamber of a charged particle analytical apparatus, said charged particle analytical apparatus having an analytical axis and projecting a charged particle beam generally along said analytical axis towards a sample, the adapter comprising:
    an optical element located so as to receive an input light beam along an optical axis at an angle to said analytical axis, said optical element directing said input light beam generally along the analytical axis towards the sample, and collecting the scattered light received from the sample and directing said scattered light generally along the optical axis,
    wherein said optical element is movable between an operative position on said analytical axis and an inoperative position on said analytical axis and an inoperative position away from said analytical axis.

2. An adapter according to claim 1, wherein an optical system is provided for processing the input light beam and the scattered light, said optical system being movable together with the optical element as the optical element moves between the operative and inoperative positions.

3. An adapter according to claim 1, wherein an optical system is provided for processing the input light beam and the scattered light, wherein the position of the optical element is adjustable when it is in the operative position, and wherein the optical system is movable together with the optical element as it is adjusted.

4. An adapter according to claim 2, wherein the optical system includes one or more filters for rejecting light having the wavelength of the input light beam from said scattered light.

5. An adapter according to claim 2, wherein the optical analysis is by spectroscopy, and the optical system is a light injection and rejection arrangement for the spectroscopy.

6. An adapter according to claim 4, wherein the optical system is a light injection and rejection arrangement for a spectroscopy system, for use with at least two different monochromatic light inputs, comprising:
    an optical path extending between a sample to be analysed and a spectroscopy system for performing such analysis,
    first and second inputs for receiving respective first and second excitation beams at respective first and second wavelengths,
    a first filter located in the optical path, at an angle such that it directs the first input beam towards the sample, and rejects elastically scattered light received from the sample while passing inelastically scattered light for analysis towards the spectroscopy system,
    a second filter located in the optical path, at an angle such that it directs the second input beam towards the sample, and rejects elastically scattered light received from the sample while passing inelastically scattered light for analysis towards the spectroscopy system,
    light being received from the second filter which has been rejected from the optical path by the second filter when the sample is excited at the first wavelength, said light therefore representing desired inelastically scattered light, and
    said rejected but desired inelastically scattered light either being recombined with other inelastically scattered light, or being detected separately.

7. An adapter according to claim 1, wherein the optical element is a concave mirror, in order to focus the input laser beam onto the sample and collimate said scattered light.

8. An adapter according to claim 7 wherein the optical element is a paraboloid mirror.

9. A light injection and rejection arrangement for a spectroscopy system, for use with at least two different monochromatic light inputs, comprising:
    an optical path extending between a sample to be analysed and a spectroscopy system for performing such analysis,
    first and second inputs for receiving respective first and second excitation beams at respective first and second wavelengths,
    a first filter located in the optical path, at an angle such that it directs the first input beam towards the sample, and rejects elastically scattered light received from the sample while passing inelastically scattered light for analysis towards the spectroscopy system,
    a second filter located in the optical path, at an angle such that it directs the second input beam towards the sample, and rejects elastically scattered light received from the sample while passing inelastically scattered light for analysis towards the spectroscopy system,
    light being received from the second filter which has been rejected from the optical path by the second filter when the sample is excited at the first wavelength, said light therefore representing desired inelastically scattered light, and
    said rejected but desired inelastically scattered light either being recombined with other inelastically scattered light, or being detected separately.

10. An adapter for performing optical analysis of a sample mounted in a sample chamber of another analytical apparatus, said analytical apparatus having an analytical axis and projecting an analysis beam generally along said analytical axis towards a sample;
    the adapter comprising an optical element located so as to collect scattered or generated light received from the sample and directing said light generally along an optical axis at an angle to the analytical axis;
    wherein said optical element is adjustable between an operative position on said analytical axis and an inoperative position away from said analytical axis;
    characterised in that the operative position is defined by an adjustable mount which restrains movement of the optical element in six degrees of freedom.

11. An adapter according to claim 10 wherein the adjustable mount is kinematic.

12. An adapter according to claim 10 wherein the optical element is biased towards the operative position.

13. An adapter according to claim 12 wherein there is reduced pressure inside the sample chamber, and wherein the reduced pressure is used to bias the optical element towards the operative position.

14. An adapter according to claim 10 wherein the optical element also receives an input light beam along the optical axis, said optical element directing said input light beam towards the sample.

15. An adapter according to claim 10 wherein the optical element is a mirror.

16. An adapter according to claim 10 wherein the optical element is a fibre optic light collection element.

17. An adapter according to claim 10 wherein the optical axis is generally transverse to the analytical axis.

18. An adapter according to claim 10 wherein the inoperative position is defined by a second mount which restrains movement of the optical element in six degrees of freedom.

19. An adapter according to claim 18 wherein the second mount is adjustable.

20. An adapter for performing optical analysis of a sample mounted in a sample chamber of another analytical apparatus, said analytical apparatus having an analytical axis and projecting an analysis beam generally along said analytical axis towards a sample;

the adapter comprising a first optical element having a first focal plane, the first optical element being located so as to collect scattered or generated light received from the sample and directing said light generally along an optical axis at an angle to the analytical axis;

wherein said optical element is adjustable between an operative position on said analytical axis and an inoperative position away from said analytical axis;

wherein a second optical element having a second focal plane is provided in a fixed relationship with the first optical element to direct light directed along the optical axis by the first optical element towards an optical analyser;

characterised in that the first and second optical elements are arranged such that when the first optical element is in the operative position, their focal planes are parallel with the direction of movement of the first optical element;

such that there is at least part compensation for inaccuracies in the positioning of the first optical element in its operative position.

21. An adapter according to claim 20 wherein:

a location mount is provided to define the position of the first optical element in its operative position;

and wherein when the first optical element is in the operative position, the ratio of the focal length of the first optical element to the focal length of the second optical element is inverse to the ratio of the distance along the optical path between the focal point of the first optical element and the location mount to the distance along the optical path between the focal point of the second optical element and the location mount.

22. An adapter according to claim 21 wherein the focal lengths of the first and second optical elements are equal and wherein the distance along the optical path between the focal point of the first optical element and the location mount is equal to the distance along the optical path between the focal point of the second optical element and the location mount when the first optical element is in the operative position.

23. An adapter according to claim 20 wherein the first and second optical elements comprise parabolic mirrors.

24. An adapter for performing optical analysis of a sample mounted in a sample chamber of another analytical apparatus, said analytical apparatus projecting an analysis beam towards a sample;

the adapter comprising an optical element located so as to collect scattered or generated light received from the sample and directing said light generally along an optical axis and to an optical analyzer;

wherein the optical element is a parabolic mirror;

characterised in that at least one mirror is provided to align light reflected by the parabolic mirror with the optical analyser, the position of the at least one mirror being adjustable;

and wherein distortion at the optical analyzer is corrected using image processing software.

25. An adapter according to claim 24 wherein a second parabolic mirror is located between said parabolic mirror and the optical analyzer, wherein the two arabolic mirrors are arranged in an aberration-cancelling orientation.

26. An adapter according to claim 25 wherein a further two parabolic mirrors are located between said parabolic mirror and the optical analyzer, and wherein the four parabolic mirrors are arranged in an aberration-cancelling orientation.

* * * * *

UNITED STATES PATENT AND TRADEMARK OFFICE
CERTIFICATE OF CORRECTION

| | | |
|---|---|---|
| PATENT NO. | : 6,885,445 B2 | Page 1 of 1 |
| APPLICATION NO. | : 10/211558 | |
| DATED | : April 26, 2005 | |
| INVENTOR(S) | : Robert Bennett et al. | |

It is certified that error appears in the above-identified patent and that said Letters Patent is hereby corrected as shown below:

Column 17, lines 19-20, please delete "and an inoperative position on said analytical axis."

Signed and Sealed this

Sixteenth Day of October, 2007

JON W. DUDAS
*Director of the United States Patent and Trademark Office*